United States Patent [19]

Chiang

[11] Patent Number: 5,448,181
[45] Date of Patent: Sep. 5, 1995

[54] OUTPUT BUFFER CIRCUIT HAVING REDUCED SWITCHING NOISE

[75] Inventor: David Chiang, Saratoga, Calif.

[73] Assignee: XILINX, Inc., San Jose, Calif.

[21] Appl. No.: 310,203

[22] Filed: Sep. 20, 1994

Related U.S. Application Data

[63] Continuation of Ser. No. 973,093, Nov. 6, 1992.

[51] Int. Cl.⁶ .................. H03K 17/16; H03K 19/0948
[52] U.S. Cl. ........................................ 326/27; 326/58; 326/83
[58] Field of Search ............... 307/451, 443, 473, 594, 307/601, 448, 475; 326/26–27, 57–58, 119, 121, 21, 83; 327/394, 264

[56] References Cited

U.S. PATENT DOCUMENTS

| | | | |
|---|---|---|---|
| 4,329,600 | 5/1982 | Stewart | 307/540 |
| 4,855,623 | 8/1989 | Flaherty | 307/475 |
| 4,894,560 | 1/1990 | Chung | 307/451 |
| 5,036,232 | 7/1991 | Jungert et al. | 307/448 |
| 5,095,230 | 3/1992 | Takai et al. | 307/443 |
| 5,107,142 | 4/1992 | Bhamidipaty | 307/475 |
| 5,111,076 | 5/1992 | Tarng | 307/451 |
| 5,173,627 | 12/1992 | Lien | 307/473 |
| 5,179,300 | 1/1993 | Rolandi et al. | 307/451 |
| 5,315,172 | 5/1994 | Reddy | 307/451 |
| 5,362,999 | 11/1994 | Chiang | 326/21 |

FOREIGN PATENT DOCUMENTS

| | | | |
|---|---|---|---|
| 103230 | 6/1983 | Japan | 307/594 |
| 2-125525 | 5/1990 | Japan | 307/448 |

OTHER PUBLICATIONS

Chen, *CMOS Devices and Technology for VLSI*, Prentice Hall, New Jersey, 1990, pp. 103–105.

*Primary Examiner*—Edward P. Westin
*Assistant Examiner*—Jon Santamauro
*Attorney, Agent, or Firm*—Edel M. Young; Norman R. Klivans

[57] ABSTRACT

A CMOS or NMOS output buffer equalizes the number of logic gates in the signal paths connected to both the pull up and pull down transistors. In one embodiment, the pull down transistor signal path includes the conventional inverter connected to the output of a NAND gate. The pull up transistor signal path includes a CMOS passgate including two transistors connected together controlled by the output enable signal and passing the output data signal to a conventional output inverter stage. Also an additional transistor controlled by the output enable signal provides an additional signal to the input of the pull up transistor output inverter stage when the output enable signal is low. The provision of balanced signal paths in terms of number of gates and therefore propagation time to both the pull up and pull down transistors evens out the rise and fall crowbar switching current and thus minimizes switching noise.

10 Claims, 4 Drawing Sheets

OUTPUT BUFFER CIRCUIT HAVING REDUCED SWITCHING NOISE

This application is a continuation of application Ser. No. 07/973,093, filed Nov. 6, 1992.

BACKGROUND OF THE INVENTION

Field of the Invention

This invention relates to an output buffer circuit, and specifically to an output buffer circuit having switching noise reduced by reducing the difference in the propagation delays between a pull up signal path and a pull down signal path through the buffer circuit.

DESCRIPTION OF THE PRIOR ART

Output buffer circuits are well known; one is shown schematically in FIG. 1. Such buffer circuits are typically used in integrated circuits to provide the output signals from the integrated circuit die to the integrated circuit pad, from which the signal is provided outside the integrated circuit. Low switching noise for such buffer circuits is especially desirable for integrated circuits having a large number of outputs that may be switched simultaneously. However, in the conventional output buffer circuit of FIG. 1 where both the pull up transistor Q1 and the pull down transistor Q2 are N-channel MOS transistors, there is an intrinsic skew in the signal paths associated with each of these transistors that gives rises to a substantial "crowbar" (shorting) current during output switching.

A large crowbar current undesirably increases the electrical noise in the power supply of the integrated circuit. This intrinsic skew or propagation delay differential is due to a one gate delay difference between the pull up transistor Q1 signal path and the pull down transistor Q2 signal path. This is seen in FIG. 1, where the pull up transistor Q1 includes in its signal path the output enable (OE) input terminal, NAND gate 10 and inverter 12 producing output A. However, the pull down transistor Q2 includes in its signal path the output data (D) input terminal D, inverter 14, NAND gate 16, and inverter 18. Thus the signal path of pull down transistor Q2 includes an extra logic gate (i.e. inverter 14), causing extra propagation delay.

This is illustrated in the timing diagrams of FIG. 2 where the top line represents the data signal D showing this signal going low for a particular time. The middle portion of FIG. 2 shows the signals at points A and B (i.e. at the outputs of respectively inverter 12 and inverter 18), showing that the signal at A goes low before the signal at B goes high. This creates a very small amount of noise (waveform $i_{CB}$ when signal D is falling. However when signal D is rising, it can be seen that signal A rises before signal B falls, thus causing a substantial amount of noise in waveform $i_{CB}$ at the time of the D signal rising input. This is because both of transistors Q1 and Q2 are on at this time, shorting the power supply to ground. The large "crowbar" current $i_{CB}$ thereby undesirably increases the electrical noise in the power supply of the chip during output switching. That is, the crowbar current affects the internal chip power supply by undesirably shorting together the positive voltage power supply and ground.

SUMMARY OF THE INVENTION

In accordance with the invention an output buffer circuit uses a single non-inverting CMOS pass gate in the output data signal path, instead of two inverting gates, to better equalize the pull up and pull down transistor signal paths, thus reducing the undesirable crowbar switching current. Thus the signal paths associated with both the pull up and pull down output transistors include equal numbers of series connected logic gates, reducing the delay skew present in the prior art. This provision of balanced length signal paths evens out the rise and fall of the crowbar switching currents, minimizing the electrical noise produced therefrom.

DETAILED DESCRIPTION OF THE INVENTION

Figure 3:
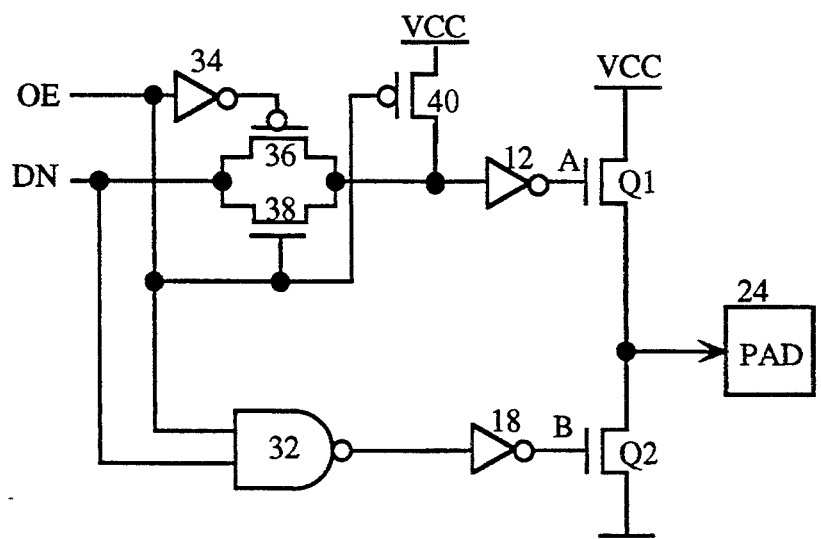
FIG. 3 shows an output buffer in accordance with the invention.

An output buffer in accordance with the invention shown schematically in FIG. 3 includes the two conventional inverters 12 and 18 connected respectively to output transistors Q1 and Q2, Q1 being the pull up transistor and Q2 being the pull down transistor. Inverter 12 and transistor Q1 are the first output stage, and inverter 18 and transistor Q2 are the second output stage, both output stages being conventionally connected to pad 24.

Figure 1:
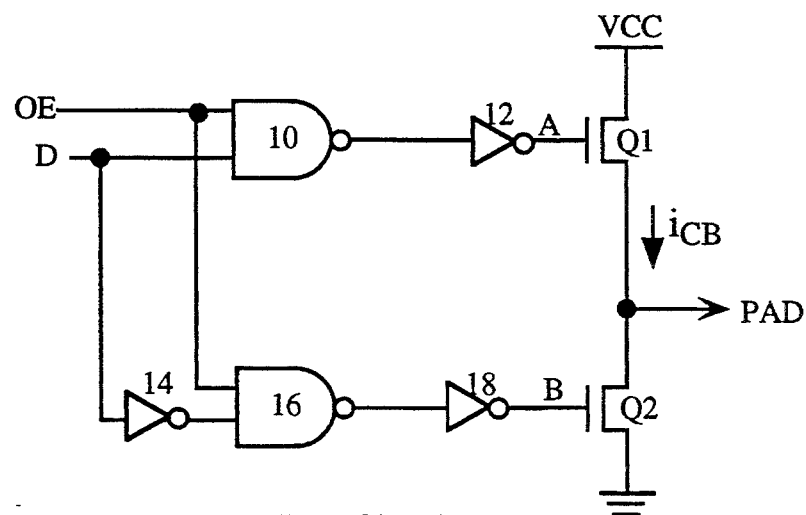
FIG. 1 shows a prior art output buffer with NMOS output transistors Q1, Q2.

The output enable OE signal and inverse output data signal DN are respectively the same and inverse of signals OE and D of FIG. 1. The lower illustrated portion of the output buffer of FIG. 3 includes conventional NAND gate 32, the output terminal of which is connected to the input terminal of output inverter 18. The input signals to NAND gate 32 are the output enable signal OE and the inverse output data signal DN.

In the upper portion of FIG. 3 the second data path connecting to transistor Q1 is shown including inverter 34 for logic control connecting to the gate of the P-channel MOS transistor 36. P-channel MOS transistor 36 is paired with complementary N-channel transistor 38 to form a CMOS pass gate. The output enable signal OE is provided via inverter 34 to the gate of transistor 36 and is provided directly to the gate of transistor 38. Thus the CMOS pass gate (which includes transistors 36 and 38) is controlled by the output enable signal OE and passes the inverse output data signal DN as shown to the input terminal of inverter 12.

Transistor 40 is a P-channel MOS transistor connected between a voltage source and the input terminal of inverter 12, and having its gate connected to the output enable signal OE terminal. Thus the CMOS pass gate which includes transistors 36 and 38 passes the inverse output data signal DN to the input terminal of inverter 12 at the same time transistor 40 is providing the voltage connected to its source terminal to the input terminal of inverter 12 whenever the output enable signal OE is low. Thus the delay skew from the DN signal terminal to points A and B is reduced, because both the upper (Q1) and the lower (Q2) signal paths have approximately the same number of gates, i.e. two gates in the logic path. In the case of the lower signal path these are NAND gate 32 and inverter 18, and in the case of the upper signal path they are the CMOS pass gate including transistors 36 and 38 and inverter 12. Note that transistors 36, 38, and 40 and inverter 34 together form a NAND gate having one inverted input signal.

Figure 2:
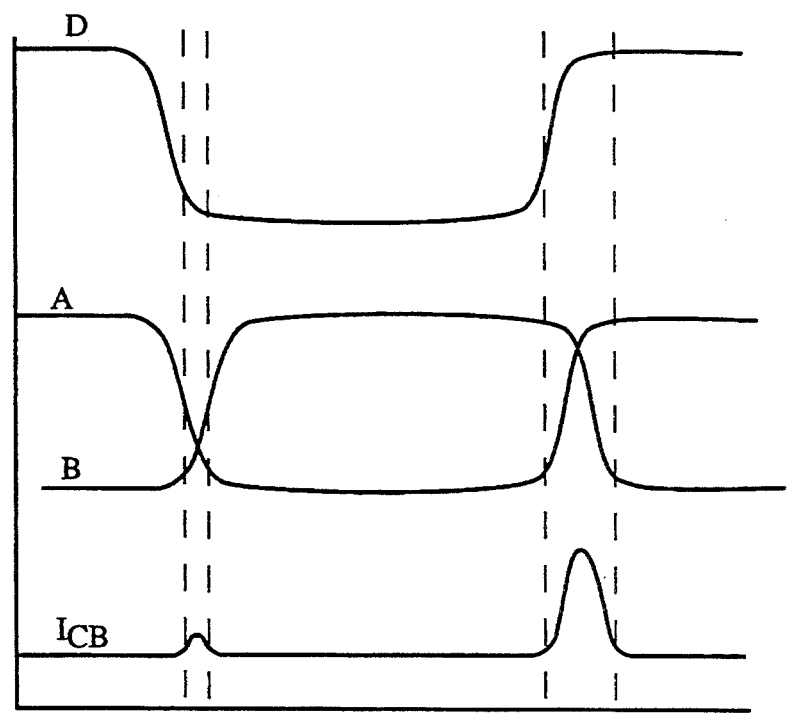
FIG. 2 shows timing diagrams for the output buffer in FIG. 1.
Figure 4:
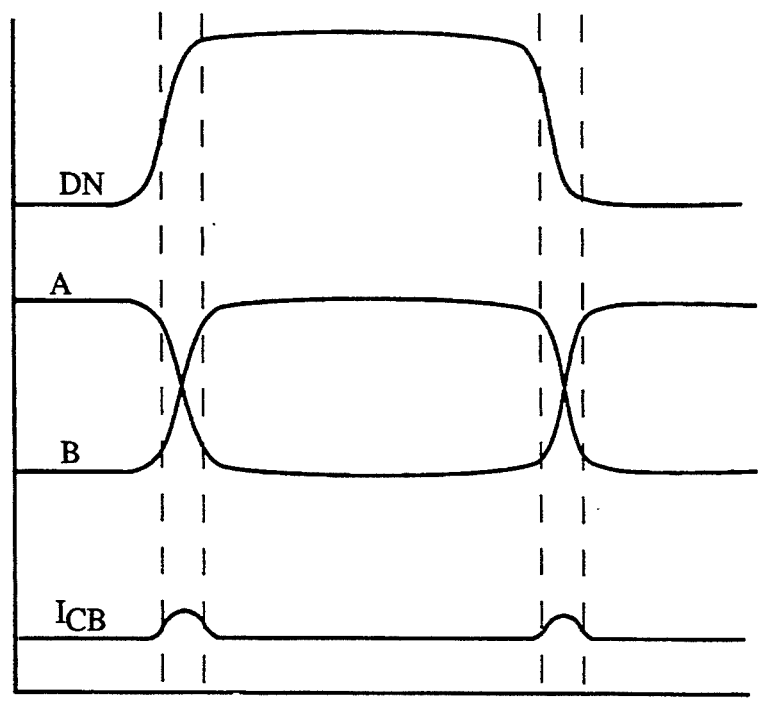
FIG. 4 shows timing diagrams for the output buffer of FIG. 3.

FIG. 4 shows a timing diagram for the circuit of FIG. 3. The top waveform labelled DN is the inverse of the D waveform of FIG. 1, going high for a particular period as shown (and hence equivalent to data signal D going low in FIG. 2). The central portion of FIG. 4 shows the waveforms at points A and B of the circuit of FIG. 3, i.e. at the output terminals of inverters 12 and 18 respectively, showing the switching occurring so that the A signal goes low at the same time the B signal goes high and vice versa. This produces the resulting crowbar current labelled $i_{CB}$ in the lower part of FIG. 4, with minimum switching noise at both of the switching points where A and B cross over in the central portion of FIG. 4. Thus the relatively balanced signal paths for transistors Q1 and transistor Q2 even out the rise and fall crowbar current and minimize switching noise.

Figure 5:
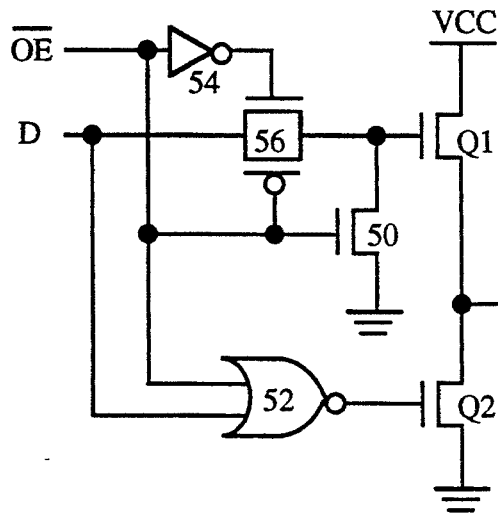
FIGS. 5 and 6 show variations on the circuit of FIG. 3.
Figure 6:
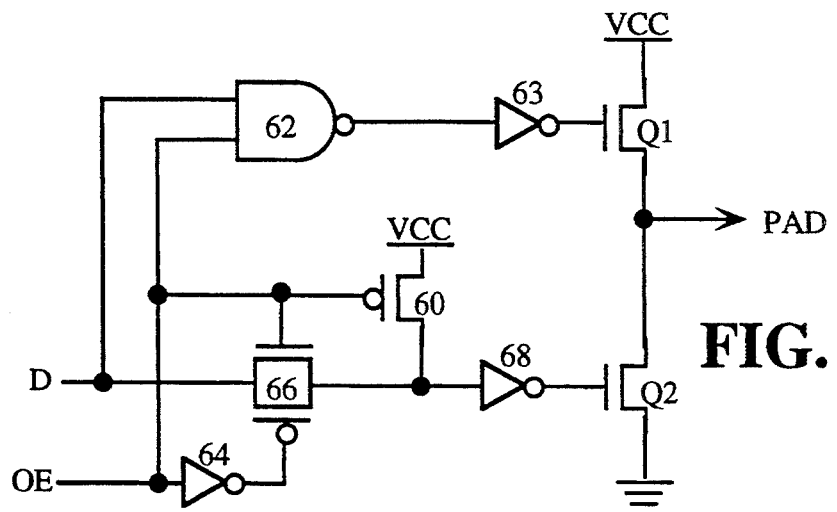

FIGS. 5 and 6 show other variations on the invention. The circuit of FIG. 5 does not include inverters 12 and 18 of FIG. 3, and therefore NOR gate 52 replaces NAND gate 32, and transistor 50 is tied to ground rather than VCC. Also the output enable signal $\overline{OE}$ is of the opposite polarity from the output enable signal OE of FIG. 3. FIG. 6 differs from FIG. 3 by providing a positive DATA signal, and using the conventional NAND gate 62 to drive the pull-up transistor Q1 and the transmission gate 66 along with inverter 64 and pull-up transistor 60 to drive pull-down transistor Q2.

Figure 7A:
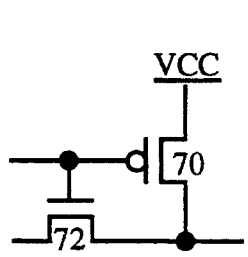
FIGS. 7A through 7C show variations on the transmission gate of FIG. 6.
Figure 7B:
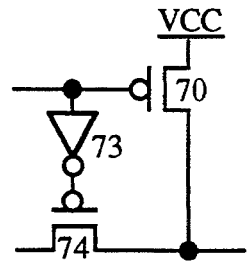
Figure 7C:
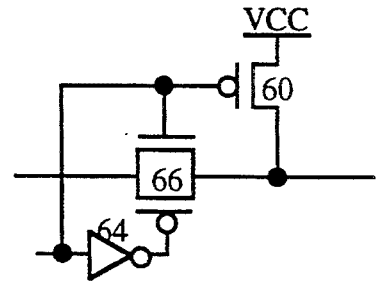

FIGS. 7A, 7B, and 7C show variations on the transmission gate 66 which may alternatively be used. Transistors 72 (FIG. 7A) and 74 (FIG. 7B) replace CMOS transmission gate 66 of FIG. 7C and FIG. 6.

Figure 8:
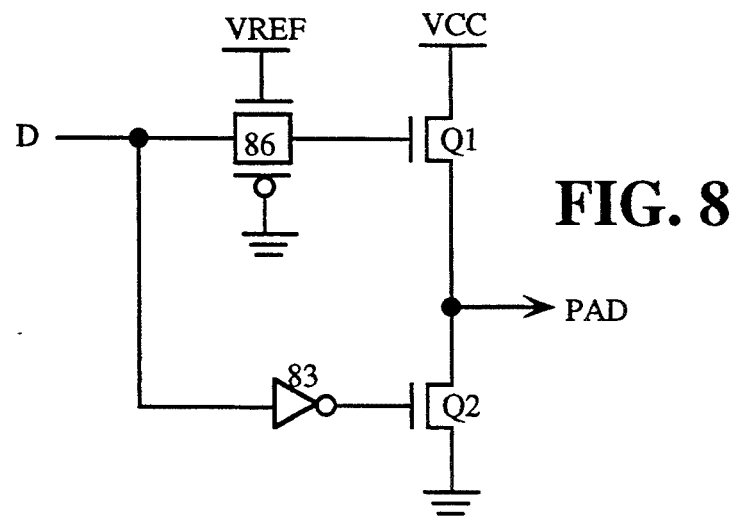
FIGS. 8 and 9 show an output buffer in accordance with the invention in which only a single input signal is provided.
Figure 9:
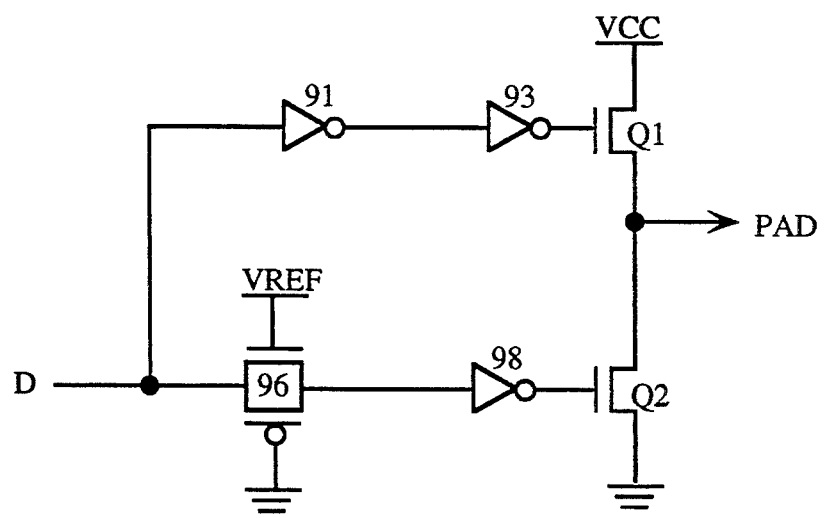

FIGS. 8 and 9 show other embodiments in which no enable signal OE is provided. The VREF signal may be equal to VCC or may be higher or lower than VCC in order to control delay, optimizing the switching characteristics.

The above description of the invention is illustrative and not limiting; it is to be appreciated that other logic elements may be substituted for those disclosed herein, and it is intended that all modifications of the above invention fall within the scope of the appended claims.

I claim:

1. A buffer with low switching noise comprising:
   first and second buffer input terminals respectively receiving an enable signal and a data signal;
   an output terminal;
   pull-up and pull-down elements connected to said output terminal, each of said pull-up and pull-down elements being N-type transistors;
   first control means having two input terminals and an output terminal, said first control means input terminals connected respectively to said first and second buffer input terminals, and said first control means output terminal driving said control terminal of said pull-down element;
   second control means having two input terminals and an output terminal, said second control means including a transmission gate having a control terminal driven by said enable signal and an input terminal driven by said data signal, said second control means input terminals being connected respectively to said first and second buffer input terminals, and said second control means output terminal driving said control terminal of said pull-up element; and
   wherein the same number of logic gates are in first and second signal paths between said second buffer input terminal and said output terminal, said first signal path being via said first control means and said second signal path being via said second control means.

2. A buffer as in claim 1 in which said transmission gate is a CMOS transmission gate having two control terminals, one control terminal of said transmission gate being driven through an inverter.

3. A buffer with low switching noise comprising:
   first and second buffer input terminals respectively receiving an enable signal and a data signal;
   an output terminal;
   pull-up and pull-down elements connected to said output terminal, each of said pull-up and pull-down elements being N-type transistors;
   first control means having two input terminals and an output terminal, said first control means input terminals connected to said first and second buffer input terminals, and said first control means output terminal driving said control terminal of said pull-up element; and
   second control means having two input terminals and an output terminal, said second control means including a transmission gate having a control terminal driven by said enable signal and an input terminal driven by said data signal, said second control means input terminals connected respectively to said first and second buffer input terminals, and said second control means output terminal driving said control terminal of said pull-up element; and
   said first and second control means providing the same number of delay-causing elements in respectively first and second signal paths between said second buffer input terminal and said output terminal, said first signal path being via said first control means and said second signal path being via said second control means.

4. A buffer as in claim 3 in which said transmission gate is a CMOS transmission gate having two control terminals, one control terminal of said transmission gate being driven through an inverter.

5. A buffer with low switching noise, comprising:
   a first input terminal for receiving an enable signal and a second buffer input terminal for receiving a data signal;
   a logic gate having an input terminal connected to each of said first and second buffer input terminals, and having an output terminal;
   a first output stage having an input terminal connected to said output terminal of said logic gate;
   a pass gate having a data input terminal connected to said second buffer input terminal, and a control terminal connected to said first buffer input terminal, and having an output terminal;

a first output stage having an input terminal connected to said output terminal of said logic gate; and a second output stage having an input terminal connected to said output terminal of said first logic gate wherein each of said first and second output stages include an N-type transistor;

wherein a first signal path between said second buffer input terminal and said first output stage, and a second signal path between said second buffer input terminal and said second output stage each have an equal number of gates.

6. The buffer of claim 5, further comprising means for providing a signal which causes said first output stage to be off when said pass gate is off.

7. A buffer with low switching noise, comprising:
a data input terminal;
an output terminal;
a first output stage and a second output stage, both connected to said output terminal and each of said first and second output stages including an N-type transistor;
a pass gate connected between said data input terminal and said first output stage;
a logic element connected between said data input terminal and said second output stage; and
means for providing an enabling signal to said pass gate, said pass gate passing said data input signal to said first output stage only when said enabling signal is in a predetermined logical state;
wherein a first signal path between said data input terminal and said first output stage, and a second signal path between said data input terminal and said second output stage each have an equal number of gates.

8. The buffer of claim 7, wherein said pass gate includes first and second transistors each having its control terminal connected to receive respectively said enabling signal and a logical inversion of said enabling signal.

9. A buffer as in claim 1, further comprising means for providing a signal which causes said pull-up element to be off when said transmission gate is off.

10. A buffer as in claim 3 further comprising means for providing a signal which causes said pull-up element to be off when said transmission gate is off.

* * * * *

UNITED STATES PATENT AND TRADEMARK OFFICE
CERTIFICATE OF CORRECTION

PATENT NO.  : 5,448,181
DATED       : September 5, 1995
INVENTOR(S) : David Chiang It is certified that error appears in the above-identified patent and that said Letters Patent is hereby corrected as shown below:

Col. 1, line 53, "(waveform $i_{CB}$ when" should read --(waveform $i_{CB}$) when--.

Signed and Sealed this

Sixteenth Day of July, 1996

*Attest:*

BRUCE LEHMAN

*Attesting Officer*   *Commissioner of Patents and Trademarks*